US012588259B2

(12) United States Patent
Chevalier et al.

(10) Patent No.: US 12,588,259 B2
(45) Date of Patent: Mar. 24, 2026

(54) LATERAL BIPOLAR TRANSISTOR

(71) Applicant: STMicroelectronics (Crolles 2) SAS, Crolles (FR)

(72) Inventors: Pascal Chevalier, Chapareillan (FR); Sebastien Fregonese, Leognan (FR); Thomas Zimmer, Talence (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 378 days.

(21) Appl. No.: 18/197,945

(22) Filed: May 16, 2023

(65) Prior Publication Data

US 2023/0387208 A1     Nov. 30, 2023

(30) Foreign Application Priority Data

May 31, 2022     (FR) ...................................... 2205185

(51) Int. Cl.
 H10D 62/17          (2025.01)
 H10D 10/01          (2025.01)
                    (Continued)
(52) U.S. Cl.
 CPC ........... H10D 62/184 (2025.01); H10D 10/01 (2025.01); H10D 10/051 (2025.01);
                    (Continued)
(58) Field of Classification Search
 CPC .. H10D 62/184; H10D 10/061; H10D 10/421; H10D 62/134; H10D 10/60;
                    (Continued)

(56) References Cited

U.S. PATENT DOCUMENTS

| | | | |
|---|---|---|---|
| 7,173,320 B1 | 2/2007 | Rahim | |
| 8,558,282 B1* | 10/2013 | Cai ........................ | H10D 10/60 |
| | | | 257/E21.372 |

(Continued)

FOREIGN PATENT DOCUMENTS

| | | |
|---|---|---|
| CN | 107579117 A | 1/2018 |
| CN | 220627810 U | 3/2024 |

(Continued)

OTHER PUBLICATIONS

INPI Search Report and Written Opinion for priority application, FR 2205185, report dated Dec. 21, 2022, 12 pgs.

(Continued)

*Primary Examiner* — Syed I Gheyas
(74) *Attorney, Agent, or Firm* — Crowe & Dunlevy LLC

(57)     ABSTRACT

A lateral bipolar transistor includes an emitter region doped with a first conductivity type, having a first width and a first average doping concentration; a collector region doped with the first conductivity type, having a second width greater than the first width of the emitter region and a second average doping concentration lower than the first average doping concentration; and a base region positioned between the emitter and collector regions. The emitter, collector and base regions are arranged in a silicon layer on an insulator layer on a substrate. A substrate region that is deprived of the silicon and insulator layers is positioned on a side of the collector region. A bias circuit is coupled, and configured to deliver, to the substrate region a bias voltage. This bias voltage is controlled to modulate an electrostatic doping of the collector region.

23 Claims, 9 Drawing Sheets

(51) Int. Cl.
   *H10D 10/40*        (2025.01)
   *H10D 62/13*        (2025.01)

(52) U.S. Cl.
   CPC ......... *H10D 10/061* (2025.01); *H10D 10/421*
      (2025.01); *H10D 62/134* (2025.01); *H10D*
      *62/137* (2025.01)

(58) Field of Classification Search
   CPC ...... H10D 62/60; H10D 10/021; H10D 10/80;
      H10D 62/10; H10D 62/103; H10D
      62/124; H10D 64/231; H10D 64/281;
      H10D 84/645
   See application file for complete search history.

(56)            References Cited

U.S. PATENT DOCUMENTS

|  |  |  |  |  |
|---|---|---|---|---|
| 9,536,788 | B1 * | 1/2017 | Ning ...................... | H10D 10/60 |
| 2007/0275533 | A1 * | 11/2007 | Vaed ...................... | H01L 23/481 |
|  |  |  |  | 257/E29.189 |
| 2013/0200942 | A1 | 8/2013 | Cai et al. |  |
| 2015/0097265 | A1 * | 4/2015 | Lin ...................... | H10D 10/061 |
|  |  |  |  | 438/335 |

|  |  |  |  |  |
|---|---|---|---|---|
| 2017/0110492 | A1 | 4/2017 | Gordon et al. |  |
| 2018/0012965 | A1 * | 1/2018 | Athanasiou .......... | H10D 64/512 |
| 2023/0075062 | A1 * | 3/2023 | Yu .......................... | H10D 64/01 |

FOREIGN PATENT DOCUMENTS

|  |  |  |  |
|---|---|---|---|
| FR | 3053834 | A1 | 1/2018 |
| JP | H01215058 | A | 8/1989 |
| JP | H0845953 | A | 2/1996 |
| JP | H11330083 | A | 11/1999 |

OTHER PUBLICATIONS

Bedecarrats, Thomas, et al.: "Investigation on Built-In BJT in FD-SOI BIMOS," IEEE, 2018, 4 pgs.
Cai et al "Complementary Thin-Base Symmetric Lateral Bipolar Transistor on SOI" IEDM 2011.
Derrickson et al "Assessment of THz Performance for a Lateral SiGe HBT on SOI With a Laterally Graded Base", IEEE TED 2018.
Ning et al "On the Performance and Scaling of Symmetric Lateral Bipolar Transistors on SOI", IEEE EDS 2013.
Raman et al "On the Performance of Lateral SiGe Heterojunction Bipolar Transistors With Partially Depleted Base", IEEE TED 2015.
CN First Office Action and Search Report for counterpart CN Appl. No. 202310623346.6, report dated Jul. 7, 2025, 10 pgs.

* cited by examiner 122b     112a     114     116a     110     122a 118
126c

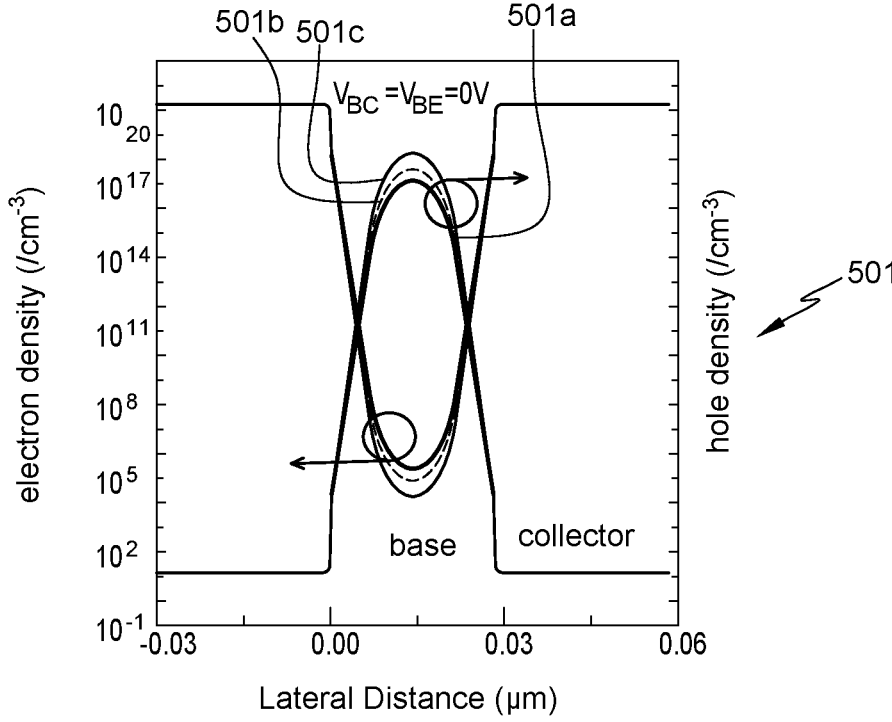
Fig. 8
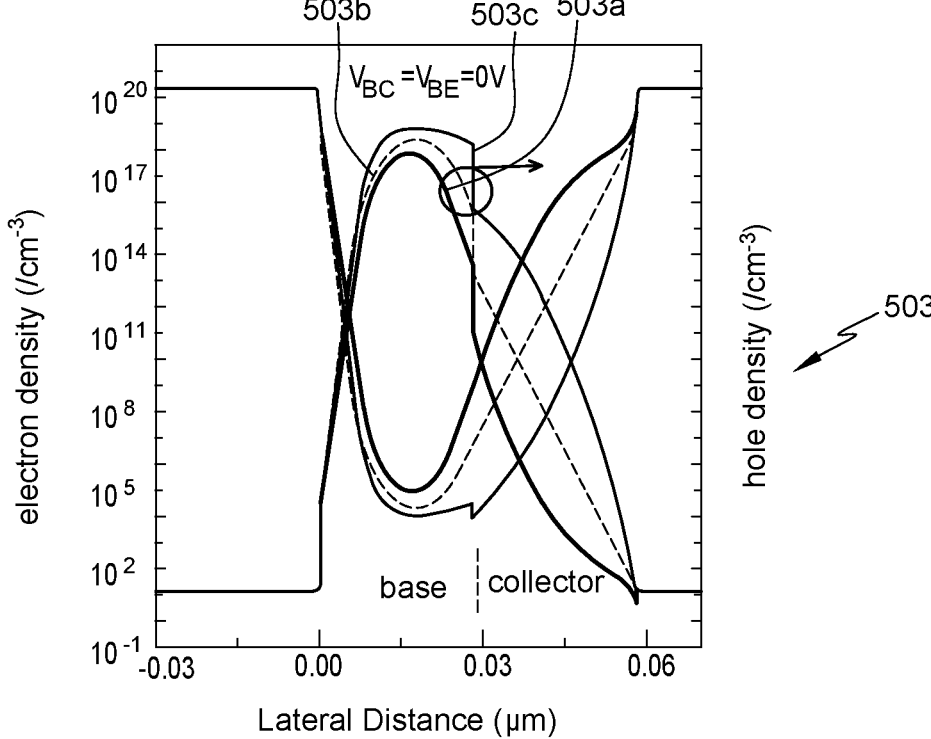

LATERAL BIPOLAR TRANSISTOR

PRIORITY CLAIM

This application claims the priority benefit of French Application for Patent No. 2205185, filed on May 31, 2022, the content of which is hereby incorporated by reference in its entirety to the maximum extent allowable by law.

TECHNICAL FIELD

The present disclosure generally concerns electronic components and, more particularly, bipolar transistors and their manufacturing method. The present disclosure particularly concerns lateral bipolar transistors, and electronic circuits comprising at least one lateral bipolar transistor.

BACKGROUND

A bipolar transistor is a semiconductor-based electronic component of the family of transistors. Its operating principle is based on two PN junctions, one forward and the other one in reverse, the two junctions being formed by a base region located between an emitter region and a collector region.

A lateral bipolar transistor is a bipolar transistor where the emitter, base, and collector regions are arranged next to each other inside and, in certain cases, on top of, a semiconductor substrate, conversely to a vertical bipolar transistor where these regions are arranged on top of each other. A lateral bipolar transistor is well adapted to integration in a CMOS (Complementary Metal Oxide Semiconductor) process, for example due to many structural similarities between a lateral bipolar transistor and a metal-oxide-semiconductor field-effect (MO SFET) transistor.

In certain applications, it is desired to improve characteristics of a lateral bipolar transistor, for example, to increase its switching speed and/or its breakdown voltage, for which it is generally searched for the best compromise for the targeted application.

There is a need in the art to overcome all or part of the disadvantages of known bipolar transistors, in particular of known lateral bipolar transistors.

SUMMARY

An embodiment provides a lateral bipolar transistor comprising: a doped emitter region of a first conductivity type, having a first width and an average doping concentration; a doped collector region of the first conductivity type, having a second width greater than the first width of the emitter region and an average doping concentration lower than the average doping concentration of the emitter region; a doped base region of the second conductivity type and positioned laterally between the emitter region and the collector region; said emitter, base, and collector regions being arranged in a silicon layer on an insulator layer, said insulator layer being arranged on a semiconductor substrate; a substrate region deprived of the silicon layer and of the insulator layer, and positioned laterally at a side of the collector region; and a bias circuit coupled to the substrate region, and configured to deliver to said substrate region a bias voltage so as to modulate the electrostatic doping of the collector region.

According to an embodiment, the transistor further comprises an extrinsic base having a third width and arranged on the base region having a fourth width.

According to a specific embodiment, the third width of the extrinsic base is smaller than the fourth width of the base region, the extrinsic base being, for example, substantially centered with respect to the base region.

According to an embodiment, the transistor further comprises a first insulator portion on a first portion of the emitter region and a second insulator portion on a first portion of the collector region, the base region being between the first portion of the emitter region and the first portion of the collector region, and the extrinsic base being between the first insulator portion and the second insulator portion.

According to an embodiment, the silicon layer has a thickness in the range from a few nanometers to some fifteen nanometers, for example, from 5 to 15 nanometers.

According to an embodiment, the insulator layer has a thickness in the range from a few nanometers to a few tens of nanometers, for example, from 10 to 50 nanometers.

According to an embodiment, the emitter region is formed by a heavily-doped region of the first conductivity type.

According to an embodiment, the collector region comprises a first sub-region that is lightly-doped of the first conductivity type and a second sub-region that is heavily-doped of the first conductivity type.

According to a specific embodiment, the first sub-region of the collector region is between the base region and the second sub-region of the collector region.

According to a specific embodiment, the first sub-region of the collector region has an average doping concentration of the first conductivity type lower than the average doping concentration of the base region of the second conductivity type, for example, by a factor of at least ten.

According to an embodiment, the base region comprises a silicon and germanium alloy.

According to an embodiment, the transistor comprises a first insulating trench crossing the silicon layer, the insulator layer and, partially, the semiconductor substrate, said first insulating trench being positioned laterally between the collector region and the substrate region.

According to an embodiment, the transistor comprises a second insulating trench crossing the silicon layer, the insulator layer and, partially, the semiconductor substrate, the emitter region being positioned laterally between said second insulating trench and the base region.

According to an embodiment, an area of the semiconductor substrate located at least under the substrate region deprived of the silicon layer and of the insulator layer, and preferably under the collector region, is doped, for example, with a gradual doping radially decreasing from said substrate region.

According to an embodiment, the transistor comprises contacting areas on the emitter region, the collector region, the substrate region and, in certain cases, on the extrinsic base, the bias circuit being coupled to the substrate region by one of said contacting areas, a silicide portion being, for example, formed under each contacting area.

An embodiment provides a method of manufacturing a bipolar transistor, said method comprising: providing a silicon layer on an insulator layer, on a semiconductor substrate; forming, in the silicon layer, a doped emitter region of a first width of a first conductivity type; forming, in the silicon layer, a doped collector region of the first conductivity type with a second width greater than the first width and an average doping concentration lower than the average doping concentration of the emitter region; and forming, in the silicon layer, a doped base region of the second conductivity type and positioned laterally between said emitter region and said collector region; forming a substrate region deprived of the silicon layer and of the insulator layer, said substrate region being positioned laterally at the side of the collector region; and forming a bias circuit coupled to the substrate region, and configured to deliver to said substrate region a bias voltage so as to modulate the electrostatic doping of the collector region.

According to an embodiment, the method comprises, prior to forming the emitter, base, collector, and substrate regions: forming a first insulating trench in the silicon layer, the insulator layer, and partially in the substrate, said first insulating trench being positioned laterally between the collector region and the location of the future substrate region; and forming a second insulating trench in the silicon layer, the insulator layer, and partially in the substrate, the emitter region being positioned laterally between said second insulating trench and the base region.

An embodiment provides a method of use of a transistor according to an embodiment, said method comprising the application, by the bias circuit, of a bias voltage to the substrate region.

According to an embodiment, the method of use comprises the application of a positive bias voltage to the substrate region, to increase the speed and/or the gain of the transistor.

According to an embodiment, the method of use comprises the application of a negative bias voltage to the substrate region, to increase the breakdown voltage of the transistor.

An embodiment provides an electronic circuit comprising at least one transistor according to an embodiment.

An embodiment provides an electronic circuit comprising a plurality of transistors according to an embodiment, at least two transistors having different bias voltages applied to the substrate region.

BRIEF DESCRIPTION OF THE DRAWINGS

The foregoing features and advantages, as well as others, will be described in detail in the rest of the disclosure of specific embodiments given by way of illustration and not limitation with reference to the accompanying drawings, in which:

FIG. 8 shows curves providing the electron density and the hole density according to the lateral distance with respect to the base/emitter junction and this, for a plurality of substrate biasing values ($V_{SUB}$), and for a symmetrical lateral bipolar transistor and an asymmetrical lateral bipolar transistor;

DETAILED DESCRIPTION

Figure 1:
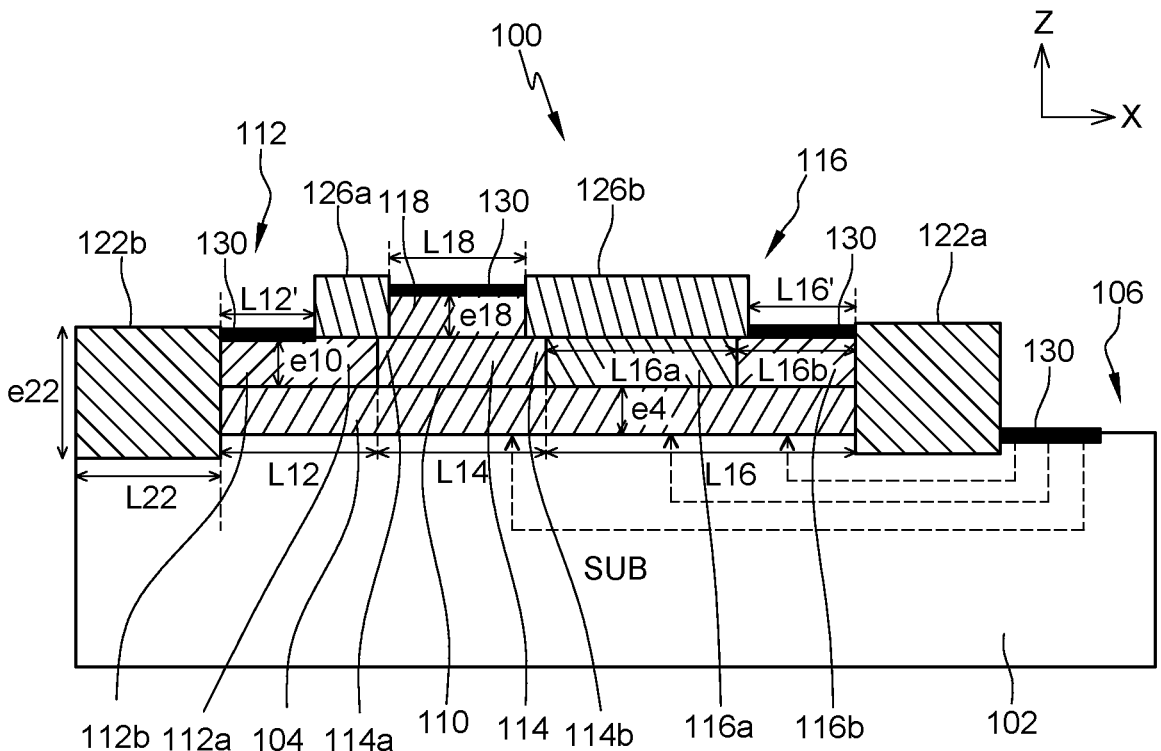
FIG. 1 is a cross-section view showing a lateral bipolar transistor according an embodiment.

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, all the manufacturing steps and the details of the elements of a lateral bipolar transistor, for example, the forming of silicide portions (salicidation) on semiconductor regions and/or the contacting area, are not detailed, since they can be formed with usual methods known by those skilled in the art.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., it is referred to the orientation of the drawings or to a lateral bipolar transistor in a normal position of use.

In the following description, a width or a distance corresponds to a dimension in the lateral direction of a lateral bipolar transistor, which corresponds to the horizontal direction X indicated in the drawings, and a thickness or a depth corresponds to a dimension in the vertical direction Z indicated in the drawings.

Unless specified otherwise, the expressions "around", "approximately", "substantially" and "in the order of" signify within 10%, and preferably within 5%.

The embodiments shown in the drawings, and described in the following description, comprise an NPN-type lateral bipolar transistor, the N doping corresponding to the first conductivity type, and the P doping to the second conductive type.

However, those skilled in the art will easily understand that the principles described in the present disclosure may be applied to a PNP-type lateral bipolar transistor, the P doping then corresponding to the first conductivity type, and the N doping to the second conductivity type.

FIG. 1 is a cross-section view showing a bipolar transistor 100 according to an embodiment.

The transistor 100 is manufactured in semiconductor (for example, silicon) on insulator (SOT) substrate technology and comprises a semiconductor substrate 102 (SUB), an insulator 104 created in substrate 102 by using, for example, a separation by implanted oxygen (SIMOX) method or a Smart Cut method, and a thin single-crystal silicon layer (Si) 110 on insulator 104. For example, substrate 102 is based on silicon (Si). Insulator 104 may be an oxide (BOX, for Buried Oxide), for example, based on silicon dioxide ($SiO_2$).

Preferably, the transistor is in a technology referred to as "Fully-Depleted SOI" (FD-SOI), that is, enabling to operate in fully depleted mode, referring to the operation of CMOS FD-SOI transistors.

Preferably, thin silicon layer 110 has a thickness e10 in the range from a few nanometers to some fifteen nanometers, for example, from 5 to 15 nm.

Preferably, insulator layer 104 has a thickness e4 in the range from a few nanometers to a few tens of nanometers, for example, from 10 to 50 nm.

Transistor 100 comprises an N doped emitter region 112, an N doped collector region 116, and a P doped base region 114 formed between emitter region 112 and collector region 116.

Emitter region 112, base region 114, and collector region 116 are formed laterally next to each other in silicon layer 110, the base region being between the emitter region and the collector region.

Emitter region 112 is heavily N doped (N+), base region 114 is heavily P doped (P+), and collector 116 comprises a first lightly N doped (N–) collector sub-region 116a and a second heavily N doped (N+) collector sub-region 116b, the first collector sub-region 116a being arranged between base region 114 and second collector sub-region 116b. This doping difference between the emitter and the collector creates a doping asymmetry of the transistor. In this context, being "heavily" doped means an average doping concentration greater than or equal to $1\times10^{19}$ at/cm$^3$, and being "lightly" doped means an average doping concentration less than $1\times10^{19}$ at/cm$^3$. Further, the width L16 of collector region 116 is greater than the width L12 of emitter region 112, creating a geometric asymmetry of the transistor. Thus, transistor 100 is referred to as asymmetrical, both geometrically and by the doping.

The portion of the silicon layer corresponding to base region 114 may be treated to form a silicon-germanium (SiGe) alloy in said base region. The germanium in the base enables to improve the performance of the transistor, which is then of heterojunction bipolar transistor (HBT) type. For example, the addition of germanium in the base region may decrease the voltage between the emitter region and the base region due to the smaller bandgap of the SiGe alloy with respect to silicon. According to an alternative mode, the base region is made of silicon, the transistor then being a transistor of bipolar junction type (BJT).

This base region 114 corresponds to a base region called "intrinsic" (active portion of the base, located between the emitter region and the collector region).

This intrinsic base region is topped with a base region called "extrinsic" 118, which may also be designated with the term "extrinsic base", and which is an electric connection portion, via which intrinsic base region 114 can be biased during the transistor operation. Extrinsic base 118 is, for example, based on polycrystalline silicon, or polysilicon (Poly).

Preferably, the width L18 of extrinsic base 118 is smaller than the width L14 of base region 114, and the extrinsic base is positioned with respect to the base region so that first and second portions 114a, 114b at the two lateral ends of base region 114 are not covered with extrinsic base 118.

For example, the width L14 of base region 114 is in the range from approximately to 100 nm, and the width L18 of extrinsic base 118 is in the range from approximately 5 to 90 nm, where the extrinsic base may be substantially centered with respect to the base region.

Further, a portion 112a (first emitter sub-region) of emitter region 112 and the first portion 114a of base region 114 not covered with extrinsic base 118 are covered with a first insulator portion 126a (or first spacer), preferably an oxide, for example SiO$_2$. Similarly, a portion of collector region 116 and the second portion 114b of base region 114 not covered with extrinsic base 118 are covered with a second insulator portion 126b (or second spacer), preferably an oxide, for example SiO$_2$. These spacers enable to electrically insulate the extrinsic base 118 of each of emitter and collector regions 112 and 116. The fact for the first 114a and second 114b portions of base region 114 not to be covered with extrinsic base 118, but to be respectively covered with the first 126a and second 126b spacers, enables to improve the insulation of said extrinsic base with respect to each of emitter and collector regions 112 and 116.

Insulating trenches 122a, 122b are formed (etched and then filled with an insulator) in thin silicon layer 110, in insulator 104, and in substrate 102 across a certain depth, to separate transistor 100 from adjacent electronic components that may be implemented in silicon layer 110. More precisely, insulating trenches 122a, 122b partially cross substrate 102, across a thickness much smaller than the thickness of said substrate, and can be designated by the term "Shallow Trench Isolation" (STI). They may be filled with an oxide insulator, for example, SiO$_2$. A first insulating trench 122a is positioned laterally against collector region 116, and in the shown mode against second collector sub-region 116b, and a second insulating trench 122b is positioned laterally against emitter region 112.

For example, the width L16 of collector region 116 is in the range from approximately 30 to 400 nm or from approximately 30 to 300 nm, the width L16 of first collector sub-region 116a is in the range from approximately 15 to 200 nm, the width L16b of second collector sub-region 116b is in the range from approximately 15 to 200 nm, and the width L12 of emitter region 112 is in the range from approximately 15 to 200 nm.

It should be noted that, in the described embodiments, the width L16 of collector region 116 substantially corresponds to the distance between base region 114 and first insulating trench 122a, and the width L12 of emitter region 112 substantially corresponds to the distance between second insulating trench 122b and base region 114.

In the transistor 100 shown in FIG. 1, emitter region 112 and collector region 116 have a depth such that they extend all the way to insulator 104, confining base region 114 therebetween.

In the transistor 100 shown in FIG. 1, second spacer 126b covers first collector sub-region 116a and emerges onto second collector sub-region 116b. This may enable, for example, to take into account possible alignment errors on forming of the spacers (as described further on), and particularly ascertain that second spacer 126b is always slightly wider than first collector sub-region 116a, so that the latter is not silicided.

Further, transistor 100 comprises a substrate region 106 where, on substrate 102, silicon layer 110 and insulator 104 have been removed, for example, etched. Such a region is known by those skilled in the art by the term "region with no SOI" or "NO-SO" region. This substrate region 106 is positioned laterally at the other side of first insulating trench 122a with respect to collector region 116, and in the shown mode with respect to second collector sub-region 116b. In other words, first insulating trench 122a is between collector region 116 and NO-SO region 106, enabling to laterally insulate these two regions from each other. NO-SO region

106 enables to contact the substrate in order to bias it according to a technique called "back biasing", as explained hereafter.

On the other portion 112b (second emitter sub-region) of emitter region 112 not covered with first spacer 126a, on the portion of the collector region 116 not covered with second spacer 126b, on extrinsic base 118, and on at least a portion of NO-SO region 106, there may be formed a metal silicide portion 130 (designated as "silicide") and an electric contacting area 140 or "contact" (the contacts are visible in FIG. 4F) on each silicide portion. Such a silicide portion enables to strongly decrease the value of the electric resistance of the contact, that is, the resistance between the semiconductor region and the contact.

Preferably, as shown in FIG. 1, the portion of collector region 116 which is not covered with second spacers 126b is a portion of second collector sub-region 116b, so that silicide portion 130 is formed on the most heavily-doped sub-region of collector region 116, and this, to decrease the resistance of access to the collector.

The contact 140 (see, FIG. 4F) on NO-SO region 106, preferably covered with silicide 130, enables to apply to collector region 116 a bias voltage, to modulate the load by electrostatic effect in the most lightly-doped sub-region of the collector, that is, the first collector sub-region 116a, as explained hereafter. Such a biasing may be performed by means of a bias circuit 150, for example comprising a bias line 151 coupled on the one hand to a voltage generator 152 and on the other hand to NO-SO substrate region via its contact 140 (circuit shown in FIG. 4F).

Figure 2:
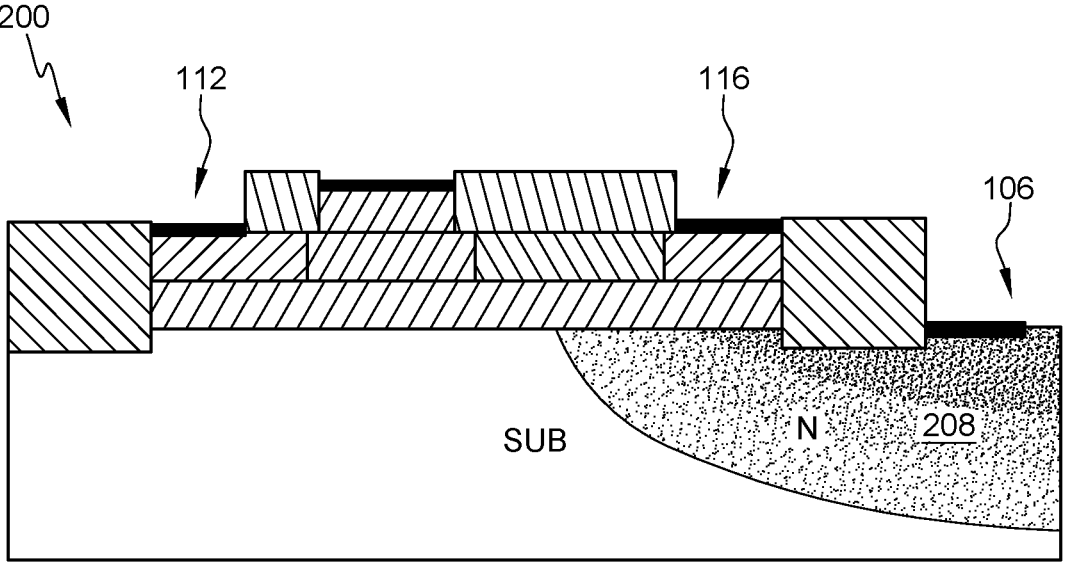
FIG. 2 is a cross-section view showing a lateral bipolar transistor according a variant of the embodiment of FIG. 1.

FIG. 2 is a cross-section view showing a lateral bipolar transistor 200 according to a variant of the embodiment of FIG. 1, which differs therefrom in that a substrate area 208 located at least under NO-SO region 106, and preferably under collector region 116, is N doped with a doping that may be gradual (i.e., exhibiting a dopant gradient), radially decreasing in a direction away from NO-SO region, for example, according to a Gaussian profile.

Figure 3:
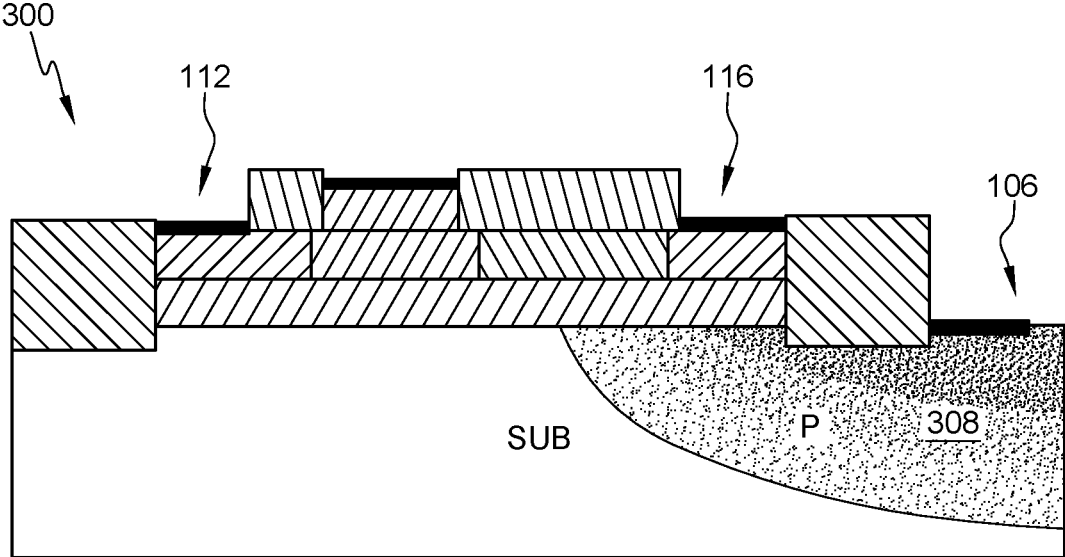
FIG. 3 is a cross-section view showing a lateral bipolar transistor according to another variant of the embodiment of FIG. 1.

FIG. 3 is a cross-section view showing a lateral bipolar transistor 300 according to another variant of the embodiment of FIG. 1, which differs therefrom in that a substrate area 308 located at least under NO-SO region 106, and preferably under collector region 116, is P doped with a doping that may be gradual (i.e., exhibiting a dopant gradient), radially decreasing in a direction away from NO-SO region, for example, according to a Gaussian profile.

The lateral bipolar transistor according to an embodiment is thus asymmetrically constructed and comprises a NO-SO region positioned laterally close to the collector region, said regions being laterally separated by an insulating trench. By applying a biasing to the substrate via a contact 140 on the NO-SO region, certain characteristics of said transistor may be controlled. In particular, the biasing of the substrate enables to modulate the "electrostatic" doping, that is, to modulate the charge by electrostatic effect (electrostatic coupling with the transistor regions), of the lightly-doped sub-region of the collector, or even of the base region by a lesser extent, by a "back-biasing" technique, that is, passing through the substrate, as shown in FIG. 1 by the arrows in dotted lines.

The bias voltage applied to substrate may, for example, be of a few volts, positive or negative, for example, between approximately 0.5 and 2 volts, and this, according to the thickness of insulator 104.

With a lateral bipolar transistor in "Fully-Depleted SOI" (FD-SOI) technology, and for example in the thickness ranges of the Si layer and of the insulating layer of the SOI provided hereabove, the bias voltage applied to the substrate may be decreased, even when the base region is also desired to be modulated by the biasing of the substrate. It is thus advantageous to combine the FD-SOI technology with the substrate biasing.

Further, the asymmetrical character of the collector, with respect to the emitter region, which is both a doping asymmetry (collector region "in average" less heavily doped than the emitter region) and a geometrical asymmetry (collector region wider than the emitter region), enables on the one hand to have a sufficiently light doping of the collector region. Indeed, the inventors have determined that the electrostatic doping of the collector was more efficient if the initial doping of said collector was lighter, or even much lighter, than in a symmetrical bipolar transistor. Typically, the collector doping is in the range from $1\times10^{16}$ to $1\times10^{18}$ at/cm$^3$ for a lateral bipolar transistor according to an embodiment, to be compared with values in the order of from $1\times10^{19}$ to $1\times10^{21}$ at/cm$^3$ for a symmetrical bipolar transistor.

The influence of the electrostatic coupling of the substrate with the transistor regions is directly linked to the level of charges present in each region and thus to the doping of each region. Thus, the access, or extrinsic (heavily-doped), regions of the transistor, corresponding to second emitter sub-region 112b and to second collector sub-region 116b, as well as the heavily-doped intrinsic region, corresponding to first emitter sub-region 112a, are only very slightly impacted by the electrostatic coupling of the substrate. Only base region 114 (intrinsic) and the intrinsic collector region corresponding to the first collector region 116a (lightly doped), will be impacted by the electrostatic coupling of the substrate. Also, if the doping of intrinsic collector 116a is much lighter than that of intrinsic base region 114, the electrostatic coupling will predominantly act on intrinsic collector region 116a.

Further, the inventors have determined that, if the back biasing has an impact mainly, and homogeneously, along vertical direction Z in intrinsic collector 116a, the effect of the back biasing may also reach the interface of base region 114 with insulator 104.

A very lightly doped intrinsic collector 116a associated with the assembly of substrate 102 and insulator 104 allows a modulation of the effective doping or of the charge in said intrinsic collector by electrostatic effect by applying a voltage on the NO-SO region 106 of substrate 102. It will be seen hereafter that this, for example, enables to switch the transistor from a very fast operating mode to a high-voltage operating mode.

On the other hand, the inventors have determined that the electrostatic doping of the collector was more efficient if the width of the collector region was greater, to favor the modulation of the electrostatic doping of the collector more than that of the base region. The principle is indeed effectively to modulate the electrostatic doping of the collector region and, by a lesser extent, that of the base region.

It should be noted that the efficiency of the electrostatic doping may also depend on the doping of the substrate, as explained hereafter.

Figure 6:
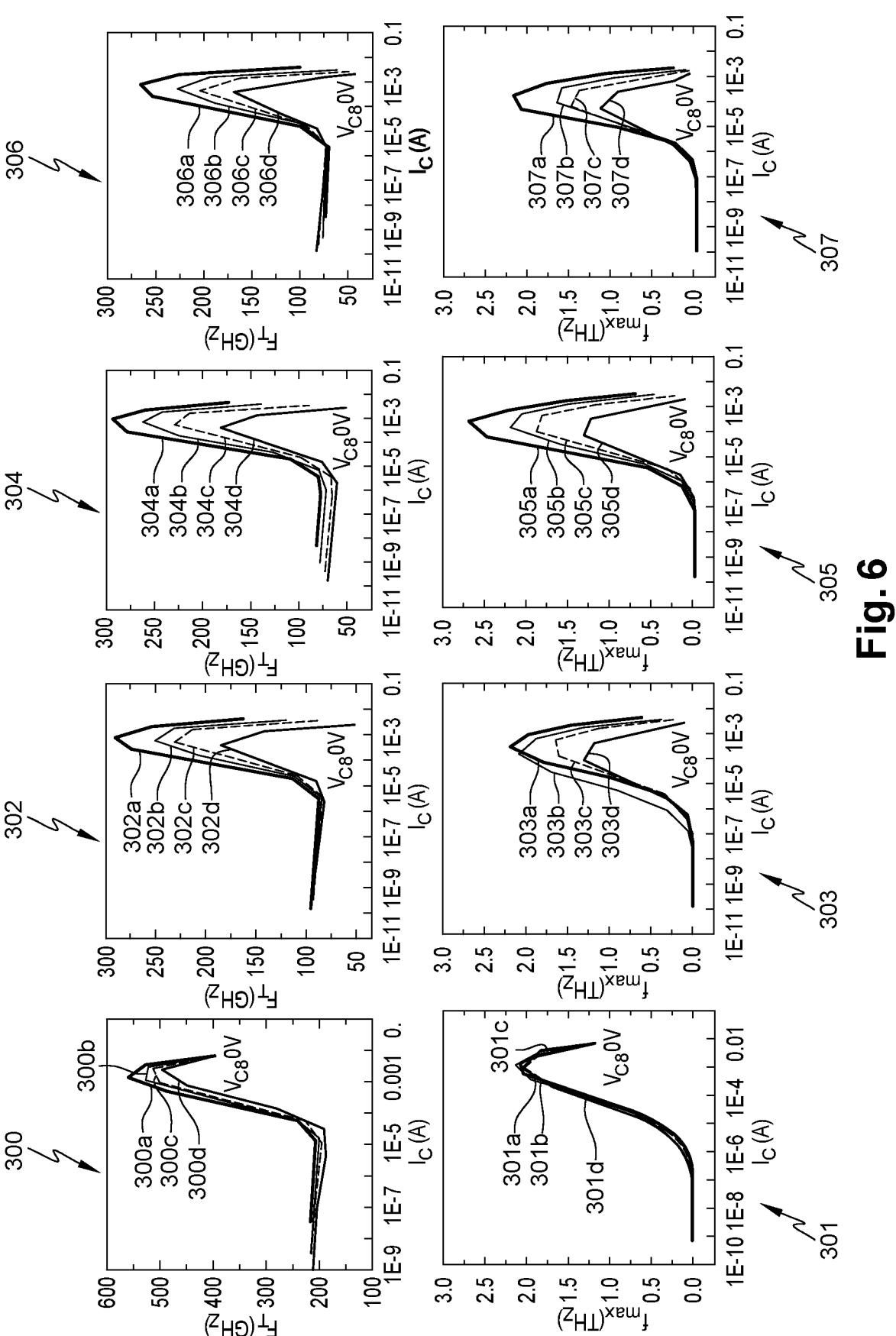
FIG. 6 shows curves giving the current gain transition frequency ($f_T$) and the maximum oscillation frequency ($f_{max}$) according to the collector current ($I_C$), and this, for a plurality of substrate biasing values ($V_{SUB}$), and for several examples of lateral bipolar transistors.
Figure 7:
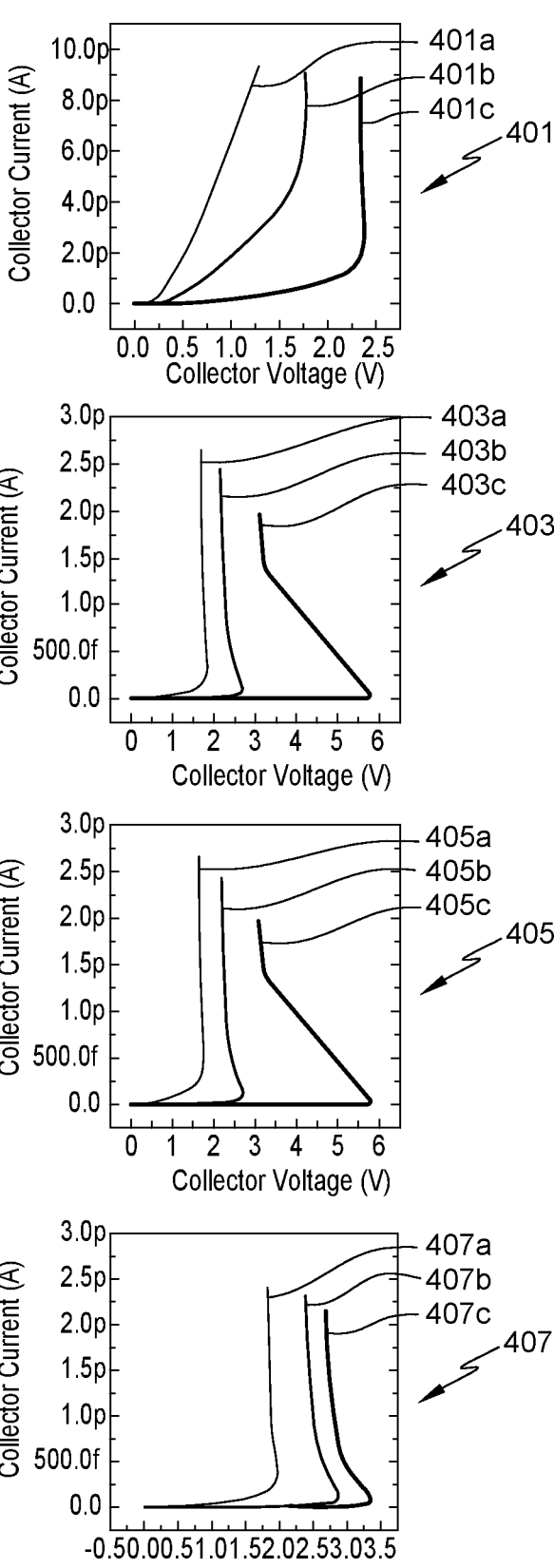
FIG. 7 shows I(V) curves providing the collector current according to the collector voltage, and this, for a plurality of substrate biasing values ($V_{SUB}$), and for several examples of lateral bipolar transistors.

It will be seen in the description of FIGS. 6 to 8 that a lateral bipolar transistor according to an embodiment enables to obtain different compromises between the switching speed (frequency) and the breakdown (avalanche) voltage for a same transistor, or even to improve the compromise between the speed and the breakdown voltage for a same transistor.

According to an example, a positive biasing of the substrate may be applied to increase the rapidity of the transistor, corresponding to a configuration with a base region of small width and/or with a heavily-doped collector region, as will be seen in the description of FIG. 6 and of FIG. 8.

According to another example, a negative biasing of the substrate may be applied to increase the breakdown voltage, corresponding to a configuration with a wider base region and/or with a lightly-doped collector region, decreasing the electric field in the collector and thus pushing back the breakdown towards a higher voltage, as will be seen in the description of FIG. 7.

According to an example of embodiment that may apply to transistors 100, 200, 300, the following dimensions, given to within 10%, preferably to within 5%, are considered: total width of the emitter region (L12): 60 nm; total width of the silicided emitter region (L12'): 30 nm; total width of the collector region (L16): 60 nm; width of the first collector sub-region (L16$a$): 30 nm; width of the second collector sub-region (L16$b$): 30 nm; width of the silicided collector region (L16'): 30 nm; width of the base region (L14): 28 nm; width of the extrinsic base (L18): 20 nm; width of the insulating trenches (L22): 30 nm; thickness of the silicon layer (e10): 7 nm; thickness of the insulator layer (e4): 25 nm; thickness of the extrinsic base (e18): 20 nm; and depth of the insulating trenches (e22): 32 nm.

FIGS. 4A to 4F are cross-section views showing steps of an example of a method of manufacturing a lateral bipolar transistor, described in reference with the transistor 100 of FIG. 1.

It is started from an SOI substrate, preferably an FD-SOI, comprising a substrate 102 (SUB) made of a semiconductor material, an insulator 104 created in substrate 102 by using, for example, a SIMOX method or a Smart Cut method, and a thin single-crystal silicon layer 110 (Si) on insulator 104. For example, substrate 102 is based on silicon. Insulator 104 may be an oxide referred to as a buried oxide (BOX), for example based on silicon dioxide (SiO$_2$).

Preferably, thin silicon layer 110 has a thickness in the range from a few nanometers to some fifteen nanometers, for example from 5 to 15 nm.

Preferably, insulator layer 104 has a thickness in the range from a few nanometers to a few tens of nanometers, for example from 10 to 50 nm.

Figure 4A:
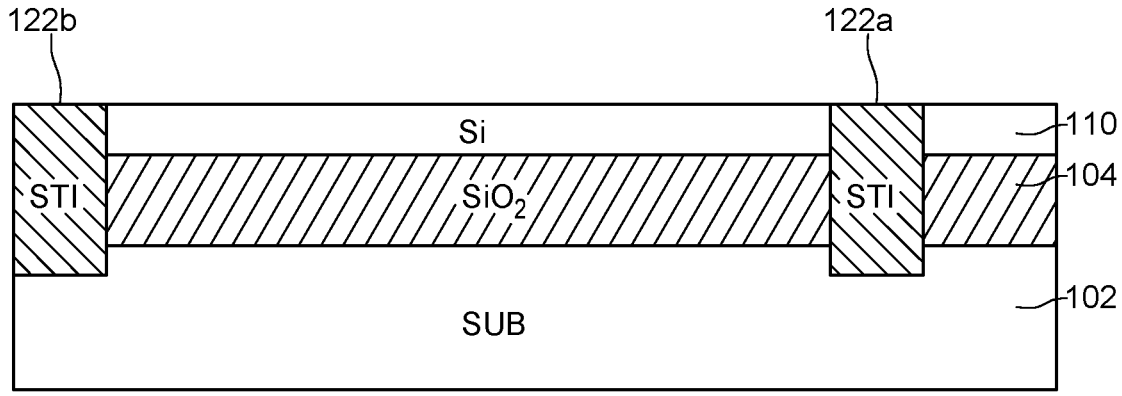
FIGS. 4A to FIG. 4F are cross-section views showing steps of a method of manufacturing a lateral bipolar transistor according to an embodiment.

FIG. 4A shows a structure obtained at the end of a step of forming insulating trenches (STI) 122$a$, 122$b$ from the thin silicon layer 110 down to a certain depth, for example, between approximately 30 and 300 nm, in substrate layer 102.

Such insulating trenches may be formed by etching and then filling of the etched portions with an electric insulating material. The insulating material is, for example, an oxide, such as a silicon oxide.

Then, the method comprises a step of forming a substrate region 106 with no SOT, or NO-SO region, where silicon layer 110 and insulator layer 104 have been etched, according to the techniques known by those skilled in the art, to access substrate layer 102. This NO-SO region is laterally formed on the other side of first insulating trench 122$a$ with respect to collector region 116.

According to an embodiment, a step of selective epitaxy may be carried out after etching to keep a planar surface on the NO-SO region.

Further, the method may comprise a step of forming a SiGe base region 114 in the thin silicon layer 110.

There exists a plurality of techniques known by those skilled in the art to form a SiGe region in a Si layer. One can mention, for example, a condensation technique which consists in depositing, on a portion of the thin Si layer intended to form the base region, a SiGe layer. This SiGe layer may be deposited by selective epitaxy, by means of a hard mask made of a dielectric material, for example SiO$_2$, formed on the thin Si layer prior to the deposition of SiGe. This hard mask comprises a hole at the level of the portion of the thin Si layer intended to form the base region. Then, a step of oxidation at a temperature from approximately 700° C. to 900° C. is carried out. During this step, germanium of the SiGe layer diffuses into the thin Si layer. The hard mask is then removed, for example, by an adapted chemical treatment.

Figure 4B:
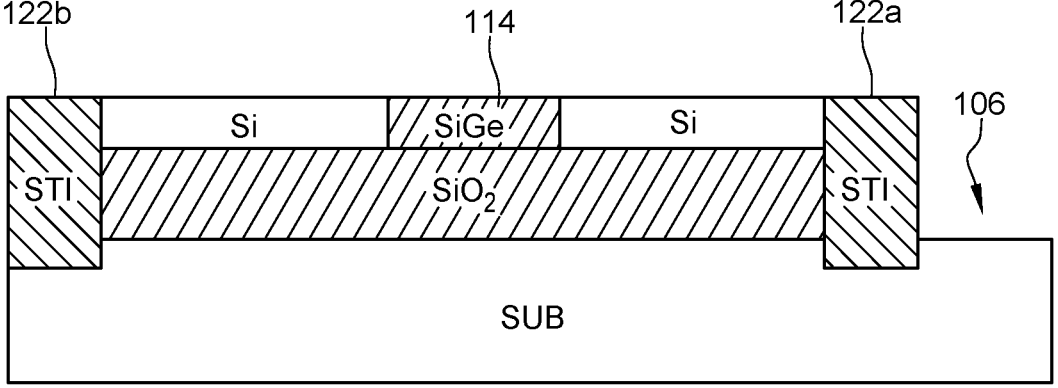

FIG. 4B shows a structure obtained at the end of these steps of forming the NO-SO region 106 and forming the SiGe based region 114.

Figure 4C:
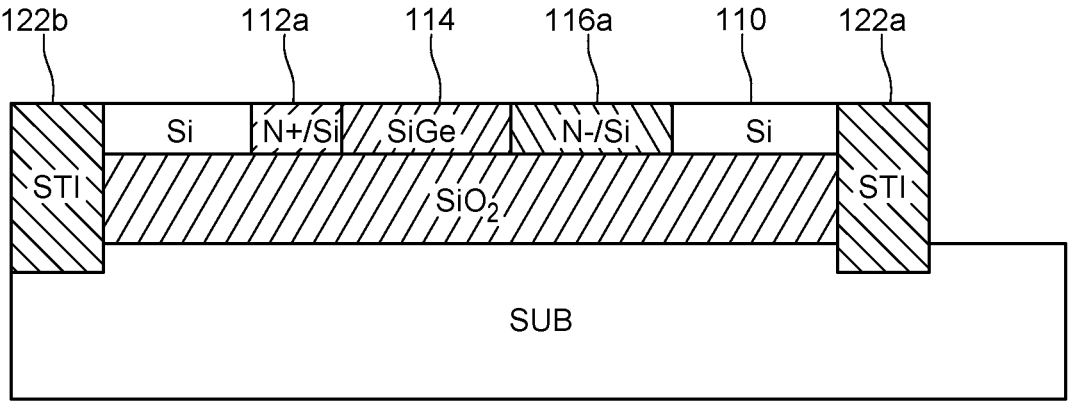

FIG. 4C shows a structure obtained at the end of steps of lithography and ion implantation, for example, with phosphorus or arsenic, in thin layer 110 to form on either side of base region 114: a first heavily N doped emitter sub-region 112$a$ (N+/Si); and a first lightly N doped collector sub-region 116$a$ (N–/Si).

Then, a hard mask 126 made of a dielectric material, for example, based on tetraethoxysilane (TEOS) to form SiO$_2$, is formed on thin silicon layer 110 (partially doped) and on insulating trenches 122$a$, 122$b$. This hard mask 126 comprises a hole 126$c$ positioned vertically in line with base region 114, the width of said hole substantially corresponding to the desired width of the extrinsic base 118 to be formed on said base region and being substantially smaller than the width of the base region. For example, hard mask 126 is formed by deposition of the dielectric material, after which hole 126$c$ is formed by photolithography followed by an etching.

A step of selective epitaxy of boron-doped polysilicon (P+/Poly) is carried out in hole 126$c$ to form extrinsic base 118. The boron of the polysilicon diffuses into the SiGe of base region 114 to heavily P-type dope said base region (P+/SiGe).

Figure 4D:
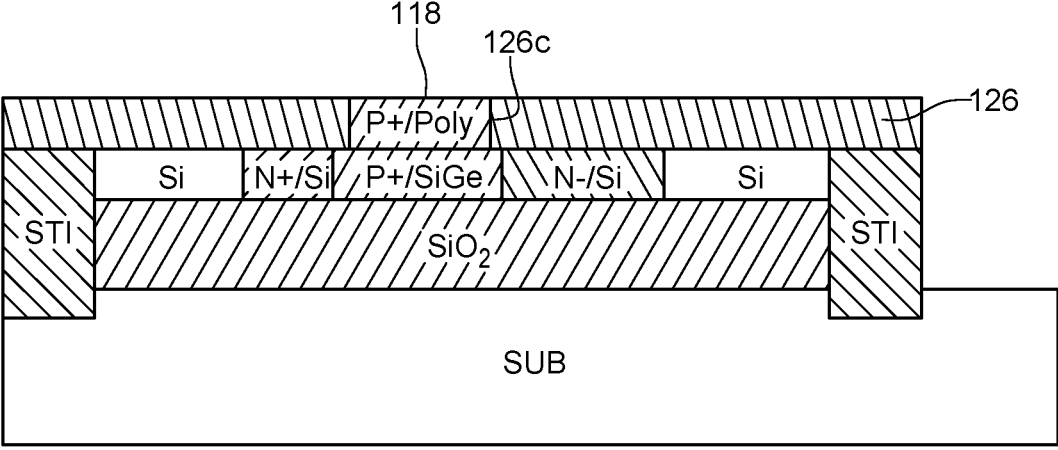

FIG. 4D shows a structure obtained at the end of these epitaxy and doping steps.

Then, hard mask 126 is partially removed to only leave a first insulator portion 126$a$ (first spacer) and a second insulator portion 126$b$ (second spacer) on either side of extrinsic base 118, respectively extending vertically in line with first emitter sub-region 112$a$ and with first collector sub-region 116$a$, that is, substantially stopping on the edges of the portions of thin silicon layer 110 which have not been doped yet.

Figure 4E:
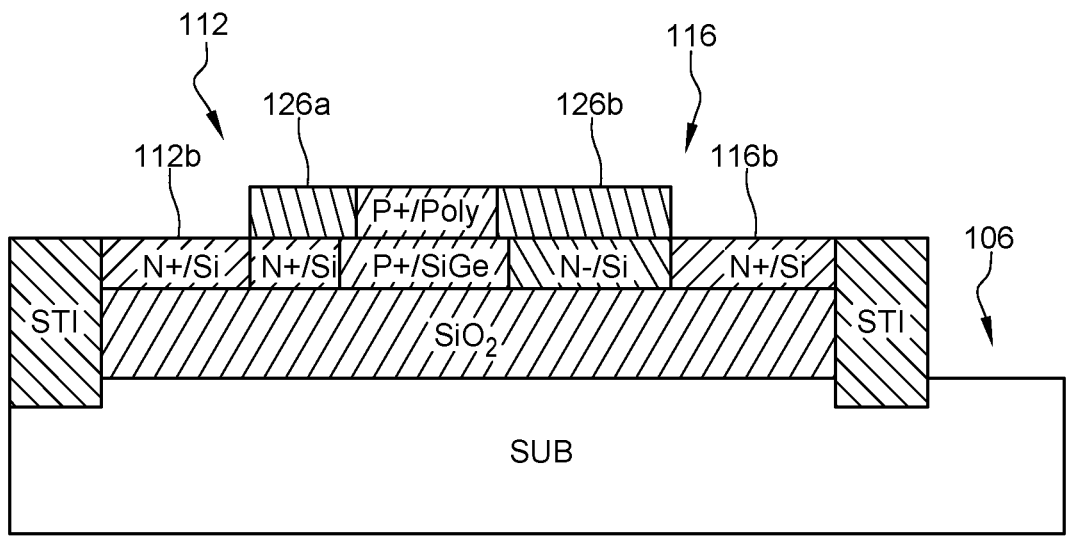

FIG. 4E shows a structure obtained at the end of this step of removal of the hard mask and of steps of ion implantation, for example, with phosphorus or arsenic, formed in the portions which have not been doped yet of thin silicon layer 110 to form: a second heavily N doped emitter sub-region 112$b$ (N+/Si); and a second heavily N doped collector sub-region 116$b$ (N+/Si).

Figure 4F:
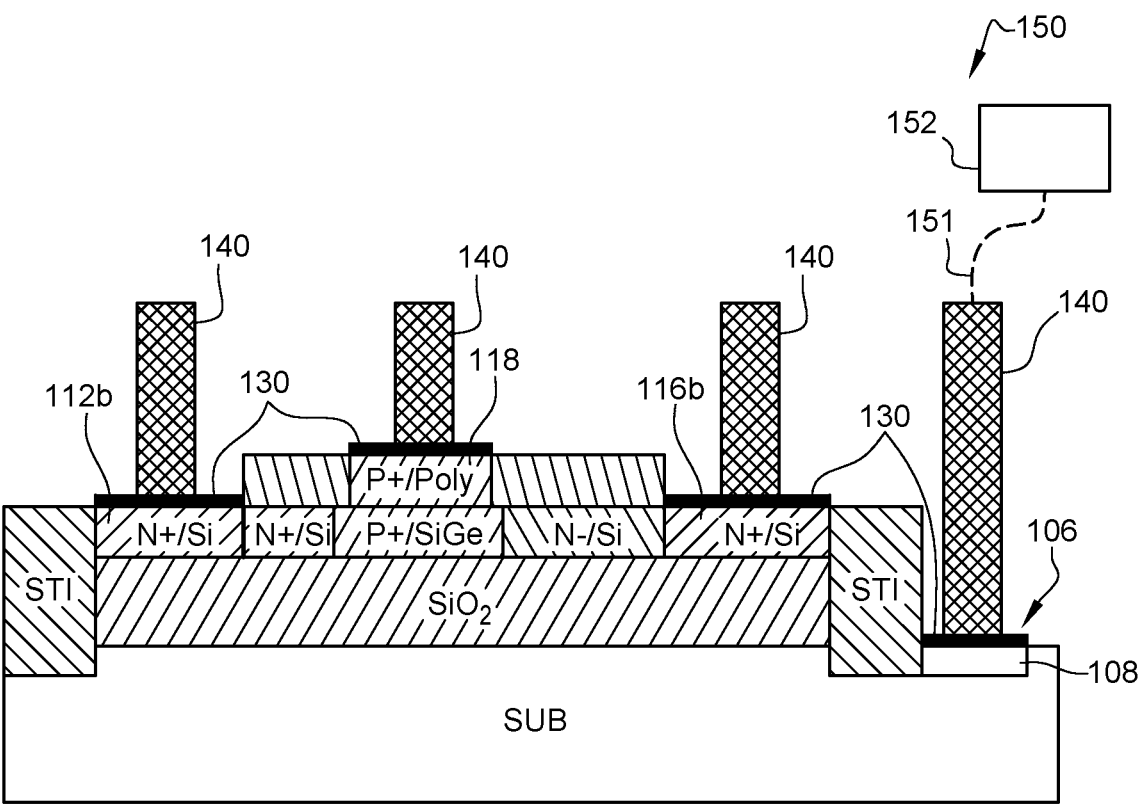

FIG. 4F shows a structure obtained at the end of steps of forming of silicide portions 130 on second emitter sub-region 112$b$, second emitter sub-region 116$b$, on extrinsic base 118 and on at least a portion of NO-SO region 106, as well as steps of forming of electric contacting areas 140 on these silicide portions. Under the silicided portion of NO-SO region 106, there may advantageously be provided an area 108 of heavy N+ or P+ doping. All these steps will not be detailed herein, being within the abilities of those skilled in the art.

To form the lateral bipolar transistor according to the embodiment of FIG. 2 or of FIG. 3, the above-described method may apply, the substrate area located at least under the NO-SO region then being doped. For a lateral bipolar transistor 200 according to the variant of FIG. 2, area 108 may be N+ doped. For a lateral bipolar transistor 300 according to the variant of FIG. 3, area 108 may be P+ doped.

There appears from this example of the method that the asymmetrical lateral bipolar transistor of the embodiments may be easily manufactured from a standard CMOS method, without adding an additional method complexity. This particularly enables to form a low-cost bipolar transistor while improving the performance with respect to other known bipolar transistors.

Figure 5:
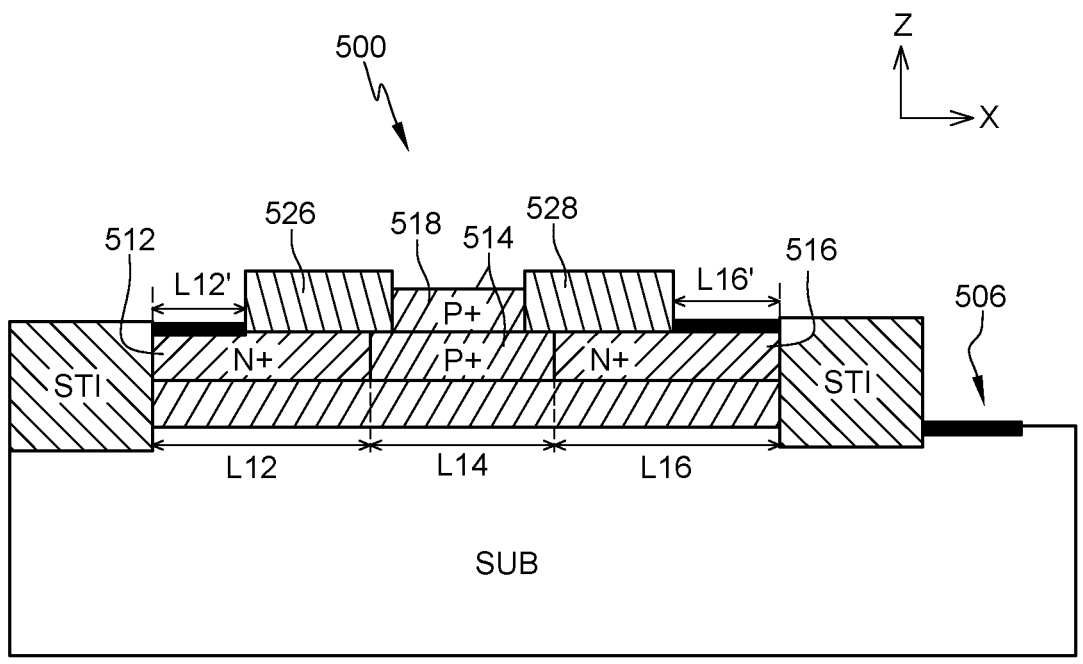
FIG. 5 is a cross-section view showing a symmetrical bipolar transistor.

FIG. 5 is a cross-section view showing an example of a symmetrical bipolar transistor 500. Emitter and collector regions 512 and 516 have substantially the same widths L12, L16 and a substantially identical doping. In other words, the distance between collector 516 and base 514 is substantially equal to the distance between emitter 512 and base 514.

FIG. 6 shows curves giving the current gain transition frequency ($F_T$) (curves 300, 302, 304, 306) and the maximum oscillation frequency ($f_{max}$)(curves 301, 303, 305, 307) according to the collector current ($I_C$), and this, for a plurality of substrate biasing values ($V_{SUB}$), and for several examples of lateral bipolar transistors: curves 300 and 301 correspond to symmetrical transistor 500, curves 302 and 303 correspond to asymmetrical transistor 100, curves 304 and 305 correspond to asymmetrical transistor 200 with an N doping, and curves 306 and 307 correspond to asymmetrical transistor 300 with a P doping; curves 300a, 301a, 302a, 303a, 304a, 305a, 306a, 307a correspond to a 2-V biasing value ($V_{SUB}$); curves 300b, 301b, 302b, 303b, 304b, 305b, 306b, 307b correspond to a 1-V biasing value ($V_{SUB}$); curves 300c, 301c, 302c, 303c, 304c, 305c, 306c, 307c correspond to a 0-V biasing value ($V_{SUB}$) (no biasing); and curves 300d, 301d, 302d, 303d, 304d, 305d, 306d, 307d correspond to a –1-V biasing value ($V_{SUB}$).

FIG. 7 shows I(V) curves providing the collector current (I) according to the collector voltage (V), and this, for a plurality of substrate biasing values ($V_{SUB}$), and for several examples of lateral bipolar transistors: curves 401 correspond to symmetrical transistor 500, curves 403 correspond to asymmetrical transistor 100, curves 405 correspond to asymmetrical transistor 200 with an N doping, and curves 407 correspond to asymmetrical transistor 300 with a P doping; curves 401a, 403a, 405a, 407a correspond to a 2-V biasing value ($V_{SUB}$); curves 401b, 403b, 405b, 407b correspond to a 0-V biasing value ($V_{SUB}$) (no biasing); and curves 401c, 403c, 405c, 407c correspond to a –2-V biasing value ($V_{SUB}$).

FIG. 8 shows curves providing the electron density (/cm³) and the hole density (/cm³) according to the lateral distance with respect to the base/emitter junction (point 0) in µm, and this, for a plurality of substrate biasing values ($V_{SUB}$), and for a plurality of examples of lateral bipolar transistors: curves 501 correspond to symmetrical transistor 500, and curves 503 correspond to asymmetrical transistor 100; curves 501a, 503a correspond to a 2-V biasing value ($V_{SUB}$); curves 501b, 503b correspond to a 0-V biasing value ($V_{SUB}$) (no biasing); and curves 501c, 503c correspond to a –2-V biasing value ($V_{SUB}$).

As indicated hereabove, the curves of FIGS. 6 and 7 have been drawn by comparing asymmetrical lateral transistors 100, 200, 300 and symmetrical lateral transistor 500, and the curves of FIG. 8 have been drawn by comparing asymmetrical lateral transistor 100 and symmetrical lateral transistor 500. For these transistors, the germanium concentration in the SiGe alloy of the base region is approximately 20% and the dopings of the different regions, for each of transistors 100, 200, 300, 500 are those indicated in table 1 hereafter.

| Doping (at/cm²) | 100 | 200 | 300 | 500 |
|---|---|---|---|---|
| Emitter/Collector/ Extrinsic base (extrinsic areas, that is, under contact) | $5.10^{20}$ | $5.10^{20}$ | $5.10^{20}$ | $5.10^{20}$ |
| Emitter (intrinsic area, i.e., under insulator portion) | $4.10^{20}$ | $4.10^{20}$ | $4.10^{20}$ | $4.10^{20}$ |
| Collector (intrinsic area, that is, under insulator portion, modulated by the biasing) | $1.10^{17}$ | $1.10^{17}$ | $1.10^{17}$ | $4.10^{20}$ |
| Intrinsic base | $3.10^{18}$ | $3.10^{18}$ | $3.10^{18}$ | $3.10^{18}$ |
| NO-SO area | No doping | $1 \times 10^{20}$ to $1 \times 10^{15}$ (Gaussian) | $1 \times 10^{20}$ to $1 \times 10^{15}$ (Gaussian) | No doping |

Further, the dimensions of transistors 100, 200, 300 used to draw the curves of FIGS. 6 and 7 are given in the example of embodiment described hereabove, the thicknesses and depth of transistor 500 are the same as those given for transistors 100, 200, 300, and the widths of transistor 500 are the following: total width of the emitter region (L12): 60 nm; width of the silicided emitter region (L12'): 30 nm; total width of the collector region (L16): 60 nm; width of the silicided collector region (L16'): 30 nm; width of the base region (L14): 28 nm; and width of the extrinsic base (L18): 20 nm.

There appears from the analysis of the curves of FIG. 6 that: the biasing of the substrate enables to modulate (increase) characteristics of current gain transistor frequency ($F_T$) and of maximum oscillation frequency ($f_{max}$) of an asymmetrical transistor, while it does not allow this, or very slightly, with a symmetrical transistor; the frequencies increase with the applied bias voltage: in particular, a positive bias voltage has to be applied to increase the transistor frequencies, and thus the rapidity and the power gain of the transistor; an N-type doping of the substrate under the collector region and the NO-SO region (transistor 200) increases the frequencies, and thus has a positive impact on the efficiency of the biasing of the substrate on the frequencies; and a P-type doping of the substrate under the collector region and the NO-SO region (transistor 300) has a rather negative impact on the efficiency of the substrate biasing.

Thus, a positive biasing of the substrate may be applied to increase the rapidity of the transistor. This corresponds to a configuration with an electron accumulation in the collector and a hole decrease in the base, as can be seen in FIG. 8. A positive biasing (curve 503a) causes a displacement of the base-collector space charge area towards the base, implying a smaller neutral base width, and a more heavily electrostatically doped collector region, thus pushing back the strong injection effects towards higher current densities. Further, the base-emitter junction capacity is decreased by the hole decrease in the base. It can also be seen in FIG. 8, by comparing curves 503 with curves 501, that the biasing has a strongly marked effect on an asymmetrical transistor (curves 503), while it has little, or almost none, on a symmetrical transistor (curves 501).

There appears from the analysis of the curves of FIG. 7 that: the biasing of the substrate enables to modulate (increase) breakdown voltage characteristics of an asymmetrical transistor, while it allows this much less with a symmetrical transistor: for example, it is remained below 2.5 V for a symmetrical transistor while 3 V can be exceeded for symmetrical transistor; the breakdown voltage increases with the applied bias voltage: in particular, a negative bias voltage has to be applied to increase the transistor breakdown voltage, and thus decrease the avalanche phenomenon; an N-type doping of the substrate under the collector region and the NO-SO region (transistor 200) has no impact on the efficiency of the biasing of the substrate on the breakdown voltage; and a P-type doping of the substrate under the collector region and the NO-SO region (transistor 300) may have a positive impact on the efficiency of the substrate biasing and on the breakdown voltage.

Thus, there appears from FIGS. 6 to 8 that the application of a bias voltage to the substrate combined with the asymmetrical character of the transistor enables to control characteristics of said transistor, and in particular to modulate the compromise between rapidity and breakdown voltage.

Figure 9:
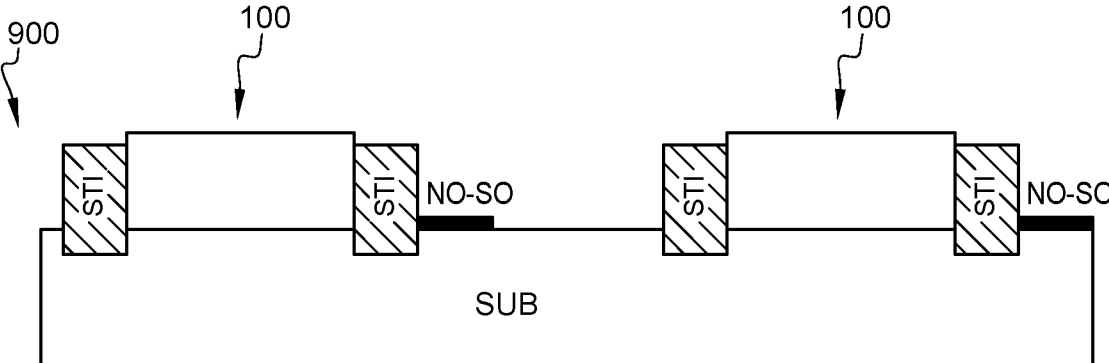
FIG. 9 shows an electronic circuit comprising a plurality of lateral bipolar transistors according to an embodiment.

A transistor, or a plurality of transistors, according to an embodiment may be integrated in an electronic circuit 900, as illustrated in FIG. 9, showing two asymmetrical lateral bipolar transistors 100 according to an embodiment with each a NO-SO region on a same substrate SUB (transistors very schematically shown). It may be a plurality of substantially similar transistors, but having different bias voltages applied thereto. It may also be a plurality of different transistors, with same bias voltages or different bias voltages. The electronic circuit may comprise other electronic components.

The preferred applications, although non-limiting, of the transistor according to an embodiment are in systems requiring both dense digital functions and RF (Radio frequency) functions, for example 5G and 6G infrastructures, or radars, particular long-range motor vehicle radars, and more generally communication systems, be it by optical fiber or wireless, including portable systems but also millimeter-range imaging systems.

A particularly advantageous application of the transistor according to an embodiment concerns Bi-CMOS (bipolar complementary metal-oxide-semiconductor) devices, which combine bipolar and CMOS transistors on a same integrated circuit chip, thus benefiting from the high-speed characteristics of the bipolar technology and from the low-consumption characteristics of the CMOS technology.

Various embodiments and variants have been described. Those skilled in the art will understand that certain features of these various embodiments and variants may be combined, and other variants will occur to those skilled in the art. In particular, the transistor may be another lateral heterojunction bipolar transistor (HBT), or a lateral bipolar junction transistor (BJT).

Finally, the practical implementation of the described embodiments and variations is within the abilities of those skilled in the art based on the functional indications given hereabove.

The invention claimed is:
1. A lateral bipolar transistor, comprising:
an emitter region doped with a first conductivity type, having a first width and a first average doping concentration;
a collector region doped with the first conductivity type, having a second width greater than the first width of the emitter region and a second average doping concentration lower than the first average doping concentration;
a base region doped with the second conductivity type and positioned laterally between the emitter region and the collector region;
wherein said emitter, base, and collector regions are arranged in a silicon layer arranged on an insulator layer, wherein said insulator layer is arranged on a semiconductor substrate;
a substrate region deprived of the silicon and insulator layers and positioned laterally at a side of the collector region;
a doped region in said semiconductor substrate extending from said substrate region under the insulating layer below the collector region but not extending below the emitter region; and
a bias circuit coupled to the doped region at the substrate region and configured to deliver to said doped region a bias voltage that modulates an electrostatic doping of the collector region.
2. The transistor according to claim 1, further comprising an extrinsic base region having a third width and arranged on the base region having a fourth width.
3. The transistor according to claim 2, wherein the third width of the extrinsic base region is smaller than the fourth width of the base region.
4. The transistor according to claim 3, wherein the extrinsic base region is substantially centered with respect to the base region.
5. The transistor according to claim 2, further comprising a first insulator portion on a first portion of the emitter region and a second insulator portion on a first portion of the collector region, wherein the base region is positioned between the first portion of the emitter region and the first portion of the collector region, and wherein the extrinsic base region is positioned between the first insulator portion and the second insulator portion.
6. The transistor according to claim 1, wherein the silicon layer has a thickness in a range from a five to fifteen nanometers.
7. The transistor according to claim 1, wherein the insulator layer has a thickness in a range from a 10 to 50 nanometers.
8. The transistor according to claim 1, wherein the emitter region comprises a heavily-doped region of the first conductivity type with an average doping concentration greater than or equal to $1\times10^{19}$ at/cm$^3$.
9. The transistor according to claim 1, wherein the collector region comprises a first sub-region that is lightly-doped of the first conductivity type and a second sub-region that is heavily-doped of the first conductivity type; and wherein the doped region extends completely under the second sub-region but only partially under the first sub-region.
10. The transistor according to claim 9, wherein the first sub-region of the collector region is positioned between the base region and the second sub-region of the collector region.
11. The transistor according to claim 9, wherein the first sub-region of the collector region has an average doping concentration of the first conductivity type lower than an average doping concentration of the base region of the second conductivity type.
12. The transistor according to claim 1, wherein the base region comprises a silicon and germanium alloy.
13. The transistor according to claim 1, further comprising a first insulating trench crossing the silicon layer, the insulator layer and, partially, the semiconductor substrate, said first insulating trench being positioned laterally between the collector region and the substrate region.

14. The transistor according to claim 13, further comprising a second insulating trench crossing the silicon layer, the insulator layer and, partially, the semiconductor substrate, the emitter region being positioned laterally between said second insulating trench and the base region.

15. The transistor according to claim 1, further comprising a contact to the emitter region, the collector region, the substrate region, wherein a silicide portion is located under each contact.

16. An electronic circuit, comprising a transistor according to claim 1.

17. An electronic circuit, comprising a plurality of transistors, wherein each transistor comprises a transistor according to claim 1, and wherein one transistor of said plurality of transistors has a first bias voltage applied thereto and another transistor of said plurality of transistors has a second bias voltage applied thereto.

18. A lateral bipolar transistor, comprising:

an emitter region doped with a first conductivity type, having a first width and a first average doping concentration;

a collector region doped with the first conductivity type, having a second width greater than the first width of the emitter region and a second average doping concentration lower than the first average doping concentration;

a base region doped with the second conductivity type and positioned laterally between the emitter region and the collector region;

wherein said emitter, base, and collector regions are arranged in a silicon layer arranged on an insulator layer, wherein said insulator layer is arranged on a semiconductor substrate;

a substrate region deprived of the silicon and insulator layers and positioned laterally at a side of the collector region; and a bias circuit coupled to the substrate region and configured to deliver to said substrate region a bias voltage that modulates an electrostatic doping of the collector region;

wherein an area of the semiconductor substrate located at least under the substrate region deprived of the silicon layer, the insulator layer, and the collector region, is doped with a gradual doping radially decreasing in a direction away from said substrate region.

16

19. A method, comprising:

providing substrate including a silicon layer on an insulator layer, wherein said insulating layer is on a semiconductor substrate;

forming, in the silicon layer, an emitter region having a first width, doped with a first conductivity type, and a first average doping concentration;

forming, in the silicon layer, a collector region having a second width greater than the first width, doped with the first conductivity type, and a second average doping concentration lower than the first average doping concentration;

forming, in the silicon layer, a base region doped with the second conductivity type and positioned laterally between said emitter region and said collector region;

forming a substrate region deprived of the silicon and insulator layers, said substrate region being positioned laterally at a side of the collector region;

forming a doped region in said semiconductor substrate extending from said substrate region under the insulating layer below the collector region but not extending below the emitter region; and forming a bias circuit coupled to the doped region at the substrate region and configured to deliver to said doped region a bias voltage that modulates an electrostatic doping of the collector region.

20. The method according to claim 19, further comprising, prior to forming the emitter, base, collector, and substrate regions:

forming a first insulating trench in the silicon layer, the insulator layer, and partially in the substrate, said first insulating trench being positioned laterally between the collector region and a location where the substrate region is to be formed; and forming a second insulating trench in the silicon layer, the insulator layer, and partially in the substrate, the emitter region being positioned laterally between said second insulating trench and the base region.

21. The method according to claim 19, further comprising applying a bias voltage to the doped region at the substrate region using the bias circuit.

22. The method according to claim 21, wherein applying comprises applying a positive bias voltage to the doped region at the substrate region, said positive bias voltage configured to increase one or more of a speed and gain of the transistor.

23. The method according to claim 21, wherein applying comprises applying a negative bias voltage to the doped region at the substrate region, said negative bias voltage configured to increase a breakdown voltage of the transistor.

* * * * *